(12) United States Patent
Fournel et al.

(10) Patent No.: US 10,438,921 B2
(45) Date of Patent: Oct. 8, 2019

(54) METHOD FOR DIRECT BONDING WITH SELF-ALIGNMENT USING ULTRASOUND

(71) Applicant: COMMISSARIAT A L'ENERGIE ATOMIQUE ET AUX ENERGIES ALTERNATIVES, Paris (FR)

(72) Inventors: Frank Fournel, Villard-Bonnot (FR); Xavier Baillin, Crolles (FR); Séverine Cheramy, Claix (FR); Patrick Leduc, Grenoble (FR); Loic Sanchez, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/746,041

(22) PCT Filed: Jul. 26, 2016

(86) PCT No.: PCT/EP2016/067827
§ 371 (c)(1),
(2) Date: Jan. 19, 2018

(87) PCT Pub. No.: WO2017/021231
PCT Pub. Date: Feb. 9, 2017

(65) Prior Publication Data
US 2018/0218997 A1    Aug. 2, 2018

(30) Foreign Application Priority Data
Jul. 31, 2015    (FR) ...................................... 15 57402

(51) Int. Cl.
*H01L 23/00*    (2006.01)
*H01L 25/00*    (2006.01)

(52) U.S. Cl.
CPC .............. *H01L 24/80* (2013.01); *H01L 24/03* (2013.01); *H01L 24/05* (2013.01); *H01L 24/97* (2013.01);
(Continued)

(58) Field of Classification Search
CPC ................. H01L 21/449; H01L 21/463; H01L 2021/607; H01L 24/80; H01L 25/50;
(Continued)

(56) References Cited

U.S. PATENT DOCUMENTS 8,303,778 B2    11/2012    Rathgeber et al.
8,425,749 B1 *    4/2013    Ravula ................... B03C 5/026
                                                                 181/141
(Continued)

FOREIGN PATENT DOCUMENTS

JP    2003-209397 A    7/2003
JP    2005-014141 A    1/2005
(Continued)

OTHER PUBLICATIONS

International Search Report dated Nov. 23, 2016, in PCT/EP2016/067827 filed Jul. 26, 2016.
(Continued)

*Primary Examiner* — Edward Chin
(74) *Attorney, Agent, or Firm* — Oblon, McClelland, Maier & Neustadt, L.L.P.

(57) ABSTRACT

A method for direct bonding an electronic chip onto a substrate or another electronic chip, the method including: carrying out a hydrophilic treatment of a portion of, a surface of the electronic chip and of a portion of a surface of the substrate or of the other electronic chip; depositing an aqueous fluid on the portion of the surface of the substrate or of the second electronic chip; depositing the portion of the surface of the electronic chip on the aqueous fluid; drying
(Continued)

the aqueous fluid until the portion of the surface of the electronic chip is rigidly connected to the portion of the surface of the substrate or of the other electronic chip: and during at least part of the drying of the aqueous fluid, emitting ultrasound into the aqueous fluid through the substrate or the other electronic chip.

12 Claims, 2 Drawing Sheets

(52) U.S. Cl.
CPC ...... *H01L 25/50* (2013.01); *H01L 2224/0381* (2013.01); *H01L 2224/056* (2013.01); *H01L 2224/05568* (2013.01); *H01L 2224/05686* (2013.01); *H01L 2224/08148* (2013.01); *H01L 2224/08238* (2013.01); *H01L 2224/80004* (2013.01); *H01L 2224/80013* (2013.01); *H01L 2224/80143* (2013.01); *H01L 2224/80205* (2013.01); *H01L 2224/80894* (2013.01); *H01L 2224/80948* (2013.01); *H01L 2224/95146* (2013.01); *H01L 2224/97* (2013.01)

(58) Field of Classification Search
CPC ......... H01L 24/05; H01L 24/03; H01L 24/97; H01L 2224/97; H01L 2224/0381; H01L 2224/05568; H01L 2224/08148; H01L 2224/95146; H01L 2224/80013; H01L 2224/08238; H01L 2224/056; H01L 2224/80894; H01L 2224/80004; H01L 2224/05686; H01L 2224/80143; H01L 2224/80948; H01L 2224/80205
See application file for complete search history.

(56) References Cited

U.S. PATENT DOCUMENTS

| | | | | |
|---|---|---|---|---|
| 8,753,924 B2* | 6/2014 | Wainerdi | ............... | H01L 24/29 257/675 |
| 2002/0056906 A1* | 5/2002 | Kajiwara | ............... | H01L 24/11 257/697 |
| 2003/0017712 A1* | 1/2003 | Brendel | ............ | H01L 21/76259 438/758 |
| 2006/0121745 A1* | 6/2006 | Fujii | .................... | H01L 21/288 438/790 |
| 2006/0166411 A1* | 7/2006 | Morisue | ............ | H01L 27/14621 438/149 |
| 2009/0286382 A1* | 11/2009 | Huff | .......................... | C23F 4/00 438/455 |
| 2010/0003771 A1* | 1/2010 | Nagai | ............... | H01L 21/67092 438/15 |
| 2011/0188337 A1 | 8/2011 | Rathgeber et al. | | |
| 2015/0348945 A1* | 12/2015 | Or-Bach | ............... | H01L 21/743 257/384 |
| 2018/0108554 A1* | 4/2018 | Xiao | ....................... | H01L 21/68 |

FOREIGN PATENT DOCUMENTS

| | | |
|---|---|---|
| JP | 2005-174979 A | 6/2005 |
| JP | 2005-317694 A | 11/2005 |

OTHER PUBLICATIONS

L. Sanchez et al., "Chip to Wafer Direct Bonding Technologies for High Density 3D Integration", Electronic Components and Technology Conference (ECTC), IEEE, May 29, 2012, pp. 1960-1964.
Jian Lu et al., "High-Efficient Chip to Wafer Self-Alignment and Bonding Applicable to MEMS-IC Flexible Integration", IEEE Sensors Journal, vol. 13, No. 2, Feb. 1, 2013, pp. 651-656.
Karl-Friedrich Bohringer et al., "Parallel Microassembly with Electrostatic Force Fields", International Conference on Robotics and Automation, IEEE, vol. 2, May 16, 1998, pp. 1204-1211.
Michael B. Cohn et al., "Microassemly Technologies for MEMS", SPIE Conference on Micromachining and Microfabrication Process Technology IV, vol. 3511, Sep. 1998, 15 pages.
Gert-willem Roemer et al., "Laser micro-machining of hydrophobic-hydrophilic patterns for fluid driven self-alignment in microassembly", Proceedings of LPM2011, Jan. 1, 2011, 10 pages.
Takafumi Fukushima et al., "Multichip Self-Assembly Technology for Advanced Die-to-Wafer 3-D Integration to Precisely Align Known Good Dies in Batch Processing", IEEE Transactions on Components, Packaging and Manufacturing Technology, vol. 1, No. 12, Dec. 2011, pp. 1873-1884.
French Search Report dated May 17, 2016, for French Application No. 1557402 filed Jul. 31, 2015.

* cited by examiner

METHOD FOR DIRECT BONDING WITH SELF-ALIGNMENT USING ULTRASOUND

TECHNICAL FIELD AND PRIOR ART

The invention relates to a method for directly bonding, in a self-aligned manner, at least one electronic chip on a substrate or on at least one other electronic chip. By electronic chip (also called "die"), it is meant a part of a substrate that has already undergone or not technological microelectronics steps forming for example electronic components in this part of the substrate. Such an electronic chip can correspond to an integrated circuit. By substrate, it is meant a plate (also called "wafer"), for example of semiconductor (generally of silicon), that has already undergone or not technological microelectronics steps forming for example electronic components in the substrate. These technological microelectronics steps are for example lithography, etching and deposition steps.

Direct bonding, also called "molecular bonding", or even "wafer bonding", is an assembly technique enabling two surfaces to be secured to each other by directly contacting both these surfaces without resorting to a bonding material (glue, wax, etc.). In this bonding type, adhesion is achieved because the surfaces to be bonded are sufficiently smooth (typically with a roughness in the order of 0.5 nm RMS (Root Mean Square)), free of particles or contaminations, and moved sufficiently close to each other to enable an intimate contact between the surfaces to be initiated. In this case, the attractive forces between both surfaces are high enough to cause a molecular adhesion of both surfaces with each other. Molecular bonding is induced by all the electronic interaction attractive forces between the atoms or molecules of both surfaces to be bonded (Van der Waals forces). Heat treatments can be made during or after bonding to increase bonding energy between the assembled surfaces.

Such a direct bonding can correspond to a so-called "hydrophobic" bonding, for example between two substrates of single crystal silicon. In this case, with two substrates of crystalline silicon, direct bonding thereby forms a crystalline "connection" between the bonded materials. Direct bonding can also correspond to a so-called "hydrophilic" bonding, for example between two substrates of oxidised silicon. In such a hydrophilic bonding, a water film present between both substrates enables hydrogen bonding interactions stronger than Van der Waals forces to be obtained.

To make a hydrophilic self-aligned direct bonding of an electronic chip to a substrate or to another electronic chip, it is possible to resort to different self-alignment techniques using a fluid as a self-alignment medium. For example, in document "*Multichip Self-Assembly Technology for Advanced Die-to-Wafer* 3-D *Integration to Precisely Align Known Good Dies in Batch Processing*" by T. Fukushima and al., IEEE Transactions on Components, Packaging and Manufacturing Technology, vol. 1, n° 12, December 2011, pages 1873-1884, there is described means for self-aligning an electronic chip on a substrate comprising hydrophilic and hydrophobic zones through the use of a water droplet contained on a hydrophilic zone corresponding to the location of the chip. The chip is arranged on the water droplet which enables the chip to be aligned with respect to its location on the substrate.

The drawback of these techniques is that they do not enable all the possible alignment configurations to be explored to choose thereafter the optimum configuration providing the best alignment of the chip on the substrate. In the method described in the abovementioned document, if the chip is misaligned by a few tens of degrees after a first positioning on the substrate, this misalignment, which can be the consequence of different reasons as for example the presence of parasitic capillarity forces undergone by the chip, can persist until the chip is fully secured to the substrate.

DISCLOSURE OF THE INVENTION

One purpose of the present invention is to provide a method for directly bonding in a self-aligned manner an electronic chip to a substrate or to another electronic chip, using a fluid as a self-alignment medium and having a better self-alignment efficiency than the bonding methods of prior art.

For this, the invention provides a method for directly bonding at least one first electronic chip to a substrate or to at least one second electronic chip, including at least the steps of;

making, on each of a face of the first electronic chip and a first face of the substrate or of the second electronic chip, at least one first and one second part having a contact angle difference towards a first fluid which is higher than about 70° with respect to each other, such that the first parts have contact angles towards the first fluid lower than those of the second parts and have shapes and dimensions substantially similar with respect to each other, and such that, on each of the face of the first electronic chip and the first face of the substrate or of the second electronic chip, the first part is delimited by the second part;

depositing the first fluid onto the first part of the first face of the substrate or of the second electronic chip;

depositing the first part of the face of the first electronic chip onto the first fluid;

removing the first fluid until a securement of the first part of the face of the first electronic chip with the first part of the first face of the substrate or of the second electronic chip is achieved;

and further including, during at least part of the removal of the first fluid, emitting ultrasound in the first fluid through the substrate or the second electronic chip.

By virtue of emitting ultrasound in the first fluid during the phase of removing the first fluid, the first electronic chip is subjected to a mechanical disturbance during this removal of the first fluid, that is during the self-alignment of the first electronic chip with respect to the first part of the first face of the substrate or of the second electronic chip. This self-alignment is dictated by minimising the wetting energy towards parts which have different contact angles. The ultrasound passes through the substrate or the second electronic chip to be propagated thereafter in the first fluid acting as a self-alignment medium of the first electronic chip. This ultrasound can thereby, depending on the power it is emitted with, either exert a mechanical pressure to the first electronic chip, or create cavitation bubbles in the first fluid which will exert in turn a mechanical pressure to the first electronic chip, modifying the position of the first electronic chip and enabling that the self-alignment forces to which the first electronic chip is subjected take amplitude again. By being exposed to ultrasound, the first electronic chip will oscillate about, or around, the optimum alignment position to reach thereafter, at the end of removing the first fluid, this optimum alignment position.

Advantageously, the first fluid may be water.

The ultrasound emitted may have a frequency higher than or equal to about 1 MHz. Such ultrasound is also called "megasound". Generally, the ultrasound used may have a frequency between about 10 kHz and 10 MHz.

The ultrasound may be emitted with a power between about 0.1 W/cm² and 5 W cm².

Advantageously, during a first part of the removal of the first fluid, the ultrasound emitting power may be such that cavitation bubbles are formed in the first fluid, and then, during a second part of the removal of the first fluid, the ultrasound emitting power is reduced in order to stop creating cavitation bubbles while exerting a mechanical pressure onto the first electronic chip. Thus, cavitation bubbles are created in the first fluid during the first part of the removal of the first fluid, thus ensuring a proper mechanical action on the first electronic chip. The oscillation of the first electronic chip then decreases during the second part of the removal until the first electronic chip is at its alignment optimum at the end of the removal of the first fluid.

In this case, the ultrasound emitting power during the first part of the removal of the first fluid may be higher than or equal to about 1 W/cm², and/or the ultrasound emitting power during the second part of the removal of the first fluid may be reduced to a value lower than or equal to about 0.2 W/cm².

The ultrasound may be emitted by an emitter acoustically coupled to a second face, opposite to the first face, of the substrate or of the second electronic chip through a film of a second fluid. The second fluid may be of a similar nature to the first fluid or not. Such a configuration ensures a proper ultrasound transmission up to the first fluid located between the first electronic chip and the substrate or between the first and second electronic chips. The phrase "fluid film" designates here a fine fluid layer, for example with a thickness between about 10 μm and 10 cm.

Advantageously, the second fluid may be water.

Making, on the face of the first electronic chip and/or on the first face of the substrate and/or of the second electronic chip, first and second parts may include implementing a step of etching the face of the first electronic chip and/or of the first face of the substrate or of the second electronic chip around first regions intended to form the first parts such that the first parts are formed by upper faces of the first regions and that the second parts are formed at least by side flanks of the first regions. This etching makes steps, or projecting zones, towards the rest of the face of the first electronic chip and/or the first face of the substrate or of the second electronic chip. Thus, on the face of the first electronic chip and/or on the first face of the substrate or of the second electronic chip, the contact angle difference between the first and second parts is achieved at least by these steps, or level differences, at least the side flanks of which correspond to the second part. Advantageously, the ridges of these steps, which delimit the first parts towards the second parts, are sharp, that is they are such that the angle formed between the side flanks and the upper faces of these steps corresponds to a re-entrant angle lower than about 90°.

In this case, the method may further include, after the etching step, a treating step modifying the contact angle value of the side flanks of the first regions and/or the contact angle value of second regions surrounding the first regions, towards the first fluid. When the first fluid is water and the treatment corresponds to a hydrophobic treatment, by thus surrounding a hydrophilic zone (first part) by a sharp ridge and a hydrophobic etching flank (second part), the hydrophilic zone is very well delimited, which enables the first fluid to be better located on this hydrophilic zone. The presence of the ridge between the first and second parts adds to the contact angle difference between both parts a further angle for example of 90°.

Removing the first fluid may advantageously include evaporating the first fluid.

The steps of the method may be collectively implemented to make direct bonding of several first electronic chips to the substrate. Thus, a plurality of first parts with a small contact angle can be delimited by one or more second parts with a strong contact angle on the first face of the substrate, thus enabling a self-alignment to be achieved, sequentially or advantageously simultaneously, of the first electronic chips to the substrate.

BRIEF DESCRIPTION OF THE DRAWINGS

The present invention will be better understood upon reading the description of example embodiments given by way of indicating and in no way limiting purposes making reference to the appended drawings in which.

Identical, similar or equivalent parts of the different Figs. described hereinafter bear the same reference numerals so as to facilitate switching from one figure to the other.

Figure 1:
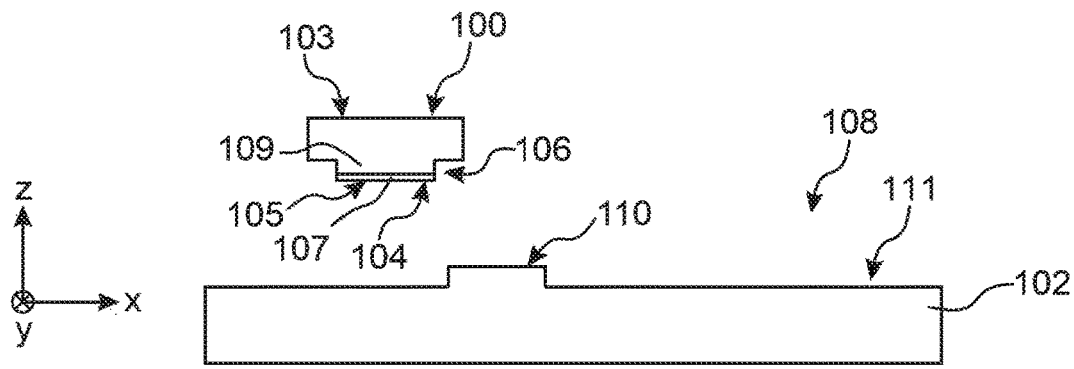
FIGS. 1 to 5 show the steps of a direct bonding method, subject matter of the present invention, according to a particular embodiment.

The different parts shown in the Figs. are not necessarily drawn to a uniform scale, to make the Figs. more readable.

The different possibilities (alternatives and embodiments) should be understood as being not exclusive to each other and can be combined together.

DETAILED DISCLOSURE OF PARTICULAR EMBODIMENTS

An exemplary implementation of a method for directly bonding an electronic chip 100 to a substrate 102 is described in connection with FIGS. 1 to 5.

The electronic chip 100, herein of silicon, is obtained by sawing a wafer, or a substrate, of silicon with a crystalline orientation <001>, with a diameter equal to about 200 mm and a resistivity between about 1 and 14 Ohm/cm with a P type doping. The dimensions of the chip are here equal to about 1 mm*1 mm (in a plane parallel to the plane (X,Y) of FIG. 1) and its thickness (dimension along the axis Z) is equal to about 725 μm. The electronic chip 100 corresponds to a semiconductor portion having already undergone or not technological microelectronics steps forming for example electronic components on this electronic chip 100. Such components (not shown in FIGS. 1 to 5) can be present at a rear face 103 and/or a front face 104 of the electronic chip 100.

The electronic chip 100 includes, at its front face 104 which corresponds to that intended to be secured to the substrate 102, a first part 105 which corresponds to the region of the front face 104 intended to contact the substrate 102. A second part 106 of the front face 104 which surrounds the first part 105 corresponds to an etched part of the electronic chip 100 and forming a step at the edges of the electronic chip 100. The first part 105 is for example formed by an upper face of a silicon oxide layer 107 arranged on a projecting part 109, for example of silicon, of the electronic chip 100. The second part 106 comprises the side flanks of the projecting part 109 and of the layer 107 as well as the other parts of the front face 104, also of silicon, which are located around the first part 105. The difference between the contact angle of the first part 105 and that of the second part 106 is higher than about 70°.

The etching forming the second part 106 of the front face 104 is made before cutting the electronic chip 100, for example by photolithography and HF etching. After being cut, the electronic chip 100 is washed by brushing with an ammonia solution (deionised water with 1% ammonia) to remove particulate contamination. The electronic chip 100 is then subjected to an oxygen plasma treatment to remove the hydrocarbon contamination which is still present. These chemical treatments enable the first part 105 of the front face 104 to be made hydrophilic. The use of a hydrofluoric acid solution or a hydrogen plasma enables the material which is revealed by this etching to be made hydrophobic, at the second part 106 of the front face 104, while leaving the first part 105 hydrophilic.

Alternatively, it is possible that the etched zones of the electronic chip 100, located at the periphery of the projecting part 109, are covered with silicon oxide. In this case, the second part 106 is only formed by the side flanks of the projecting part 109 and of the layer 107, and not by the silicon oxide present about the projecting part 109.

At the front face 104, a step having a surface (upper face of the layer 107) having a small contact angle (first part 105), for example a hydrophilic one, surrounded by the second part 106 having a strong contact angle, for example a hydrophobic one, is thus obtained. This configuration is advantageous because it enables the contact angle difference between the surface corresponding to the first part 105 and those formed by the second part 106 to be increased by about 90°. The angle formed between the upper face of the step and the rest of the front face 104 can be different from 90°, and in particular higher than or lower than 90°.

In another configuration, it is possible that the first and second parts 105, 106 are located in a same plane at the front face 104, that is the front face 104 has no projecting part. The first and second parts 105, 106 are then made by localised treatments such that one or more first hydrophilic parts 105 are surrounded by one or more second hydrophobic parts 106.

The substrate 102, here a silicon substrate, is also prepared for making direct bonding of the electronic chip 100 to a front face 108 of the substrate 102. For this, at least one trench is made by photolithography and etching in a part of the thickness of the substrate 102, about a first part 110 of the front face 108 to which the first part 105 of the front face 104 of the electronic chip 100 is to be bonded, in order to isolate this first part 110 of the front face 108 of the substrate 102 with respect to the rest of the front face 108 of the substrate 102 forming a second part 111. In FIG. 1, the entire part of the front face 108 of the substrate 102 located about the first part 110 is etched and forms the second part 111 of this front face 108. This first part 110 has a pattern and dimensions, in a main plane of the substrate 102 (plane parallel to the plane (X,Y)), which are similar to those of the first part 105 of the front face 104 of the electronic chip 100. The substrate 102 undergoes the same chemical surface treatments as those undergone by the electronic chip 100 in order to make the first part 110 of the front face 108 of the substrate 102 hydrophilic and to make the rest of the surface of the substrate 102 revealed by etching the part of the front face 108 located about the first part 110 and forming the second part 111 of the front face 108 of the substrate 102 hydrophobic.

In the example described here, the surfaces of the first parts 105 and 110 have a compatible roughness with the implementation of a direct bonding, that is they have a roughness lower than or equal to about 0.5 nm RMS.

Figure 2:
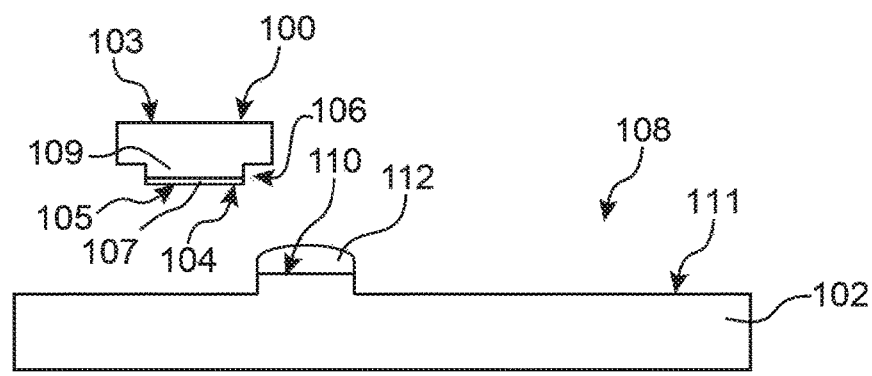
Figure 3:
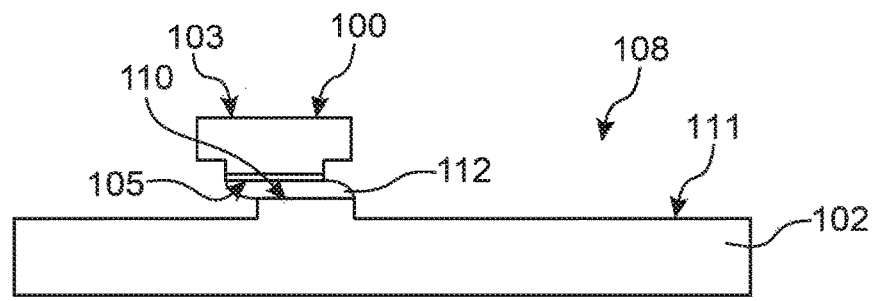
Figure 4:
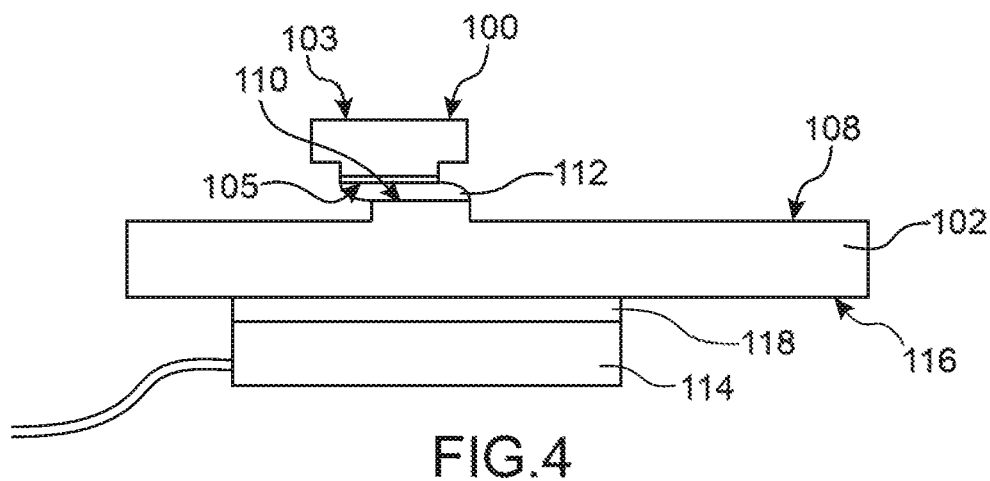
Figure 5:
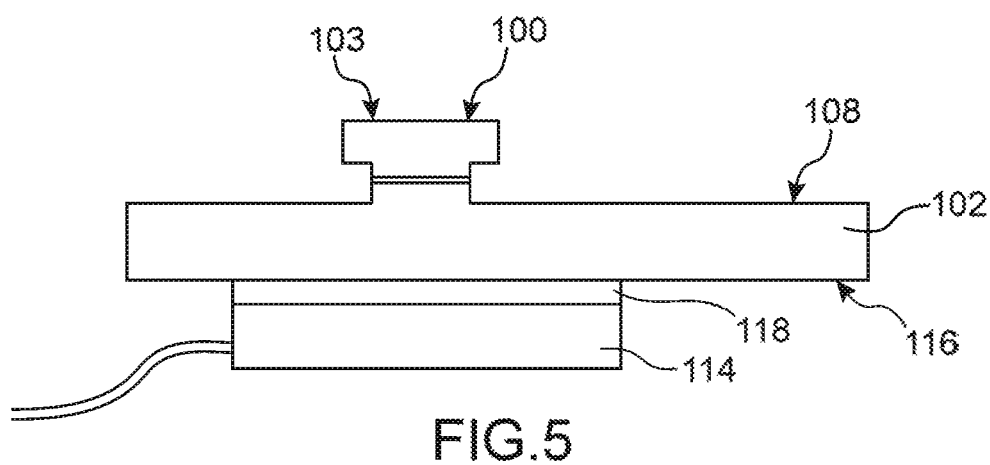

A droplet of a fluid 112, here water, is then laid onto the surface of the first part 110 of the front face 108 of the substrate 102 intended to receive the electronic chip 100 (FIG. 2). This deposition can be made individually drop by drop. However, when the front face 108 of the substrate 102 includes several first parts 110, depositing the droplets 112 can be collective and be achieved for example by the implementation of spraying or water spreading on the front face 108, the excess water present on the front face 108 being then removed. The first part 105 of the front face 104 of the electronic chip 100 is then laid on the droplet 112 (FIG. 3). The electronic chip 100 will be roughly aligned to optimise its surface in contact with the substrate 102 and thus almost align both surfaces of the first parts 105 and 110 intended to be secured to each other.

Then, a removal phase is implemented such that the droplet 112 is evaporated and that the surfaces of the parts 105 and 110 are secured to each other. During this removal phase, an ultrasound emitter 114 is acoustically coupled to a rear face 116 of the substrate 102 and emits through this rear face 116 ultrasound for example with a frequency equal to or higher than about 1 MHz and with a power higher than or equal, to about 0.2 W/cm$^2$. The acoustical coupling of the emitter 114 with the rear face 116 of the substrate 102 is made through a film of a second fluid 118, advantageously a water film (see FIG. 4). To obtain such a film 118, the second fluid is arranged on the emitter 114, and then the substrate 102 is arranged on the emitter 114. The film 118 then remains between the emitter 114 and the rear face 116 of the substrate 102.

Alternatively, it is possible to provide, between the rear face 116 of the substrate 102 and the emitter 114, a sealed device, for example a cylinder-shaped one, filled with the second fluid and which is sealed on one side by the rear face 116 of the substrate 102 and on the other side by the emitter 114.

Acoustical waves emitted by the emitter 114 will pass through the film 118, the substrate 102 and the droplet 112 to reach the electronic chip 100. The electronic chip 100 undergoes a vertical mechanical bias, that is along a direction substantially perpendicular to the desired bonding interface, via the medium formed by the droplet 112 which is located between the electronic chip 100 and the substrate 102. The mechanical action of the acoustical waves will then move the electronic chip 100 which thus will oscillate about the balance position, or optimum alignment position, which corresponds to that providing the best alignment of the surfaces facing each other (see FIG. 5).

If the ultrasound emitting power is higher than or equal to about 1 W/cm$^2$, cavitation bubbles appear in the droplet 112, enhancing ultrasound mechanical action on the electronic chip 100. Advantageously, during the removal of the droplet 112, the ultrasound is first sent with a significant power higher than or equal to about 1 W/cm$^2$. During the removal of the droplet 112, this power is gradually reduced until it reaches a value lower than or equal to about 0.2 W/cm$^2$. This gradual reduction of the ultrasound emitting power enables alignment of the electronic chip 100 with respect to the first part 110 of the front face 108 of the substrate 102 to be optimised.

Ultrasound emission can be halted either before the droplet 112 is fully removed and thus the electronic chip 100 is secured to the substrate 102, or once the securement of the electronic chip 100 to the substrate 102 is completed.

The direct bonding method previously described can be applied to the bonding of the electronic chip 100 not to the substrate 102 but on a second electronic chip. It is also possible that this direct bonding method is collectively implemented to simultaneously make a direct bonding of several electronic chips to the substrate 102.

Alternatively, the first fluid of the droplet 112 and/or the second fluid of the film 118 can be replaced by a fluid other than a water, being polar or apolar, for example methanol, acetone, dimethylsulfoxide, acetonitrile, pyridine, ammonia, ethanol, hexane, pentane, benzene, toluene, chloroform, etc.

The substrate 102 and/or the chip 100 can be made from a material other than silicon. In addition, in place of the silicon oxide of the layer 107, this layer can be formed by a semiconductor oxide other than silicon, or even for example by a semiconductor nitride, alumina, SiOC, $HfO_2$, a metal (Ti, Cu, Ni, etc.), or carbon.

After the droplet 112 is removed, the elements secured by direct bonding can be subjected to one or more heat treatments enabling adhesion forces, and thus bonding energy, between these elements to be enhanced. When electronic components are present on at least one of these elements, the temperatures of these heat treatments can be between about 200° C. and 400° C. Otherwise, heat treatment temperatures can range up to about 1 100° C.

Such a direct bonding method is advantageously applied to the field of 3D microelectronics to make bonding of electronic chips including CMOS components to a substrate including CMOS components, as well to the field of opto-electronics to make bonding of III/V semiconductor based electronic chips, including for example laser components, to a silicon substrate including CMOS components.

The invention claimed is:

1. A method for directly bonding at least one first electronic chip to a second element, which includes one of a substrate or a second electronic chip, the method comprising:
    making a first part and a second part on each of a face of the first electronic chip and a face of the second element, the first part on the face of the first electronic chip and the first part on the face of the second element having shapes and dimensions substantially similar with respect to each other, the first part being delimited by the second part on each of the face of the first electronic chip and the face of the second element;
    depositing the first fluid onto the first part of the face of the second element;
    depositing the first part of the face of the first electronic chip onto the first fluid;
    removing the first fluid until a securement of the first part of the face of the first electronic chip with the first part of the face of the second element is achieved; and
    during at least part of the removing of the first fluid, emitting ultrasound in the first fluid through the second element,
    wherein the first part and the second part have a contact angle difference towards the first fluid which is higher than about 70° with respect to each other, the first part having a contact angle towards the first fluid lower than a contact angle towards the first fluid of the second part.

2. The method according to claim 1, wherein the first fluid is water.

3. The method according to claim 1, wherein the ultrasound emitted has a frequency higher than or equal to 1 MHz.

4. The method according to claim 1, wherein the ultrasound is emitted with a power between 0.1 $W/cm^2$ and 5 $W/cm^2$.

5. The method according to claim 1, wherein, during a first part of the removing of the first fluid, the ultrasound emitting power forms cavitation bubbles in the first fluid, and then, during a second part of the removing of the first fluid, the ultrasound emitting power is reduced to stop forming cavitation bubbles while exerting a mechanical pressure onto the first electronic chip.

6. The method according to claim 5, wherein at least one of the following conditions is fulfilled:
    the ultrasound emitting power during the first part of the removing of the first fluid is higher than or equal to 1 $W/cm^2$,
    the ultrasound emitting power during the second part of the removing of the first fluid is reduced to a value lower than or equal to 0.2 $W/cm^2$.

7. The method according to claim 1, wherein the ultrasound is emitted by an emitter acoustically coupled to one of a second face of the second element, which is opposite to the one of the first face of the second element, through a film of a second fluid.

8. The method according to claim 7, wherein the film of the second fluid is a water film.

9. The method according to claim 1, wherein the making of, on at least one of the face of the first electronic chip and the second element, the first and second parts includes etching said at least one of the face of the first electronic chip and the face of the second element around a first region configured to form the first part such that the first part is formed by an upper face of the first region and the second part is formed at least by a side flank of the first region.

10. The method according to claim 9, further comprising, after the etching, modifying a contact angle of the side flank of the first region or a contact angle of the second region surrounding the first region, or both the contact angle of the side flank of the first region and the contact angle value of the second region surrounding the first region, the contact angle of the side flank of the first region being an angle at which the side flank of the first region contacts the first fluid, the contact angle of the second region being an angle at which the second region contacts the first fluid.

11. The method according to claim 1, wherein the making step, the depositing of the first fluid step, the depositing of the first part of the face of the first electronic chip step, the removing step, and the emitting ultrasound step are implemented such that plural first electronic chips are directly bonded to the substrate.

12. The method according to claim 9, further comprising treating the face of the first electronic chip, or on the face of the second element, with an oxygen plasma to remove hydrocarbon contamination after the etching step.

* * * * *